(12) United States Patent
Haba et al.

(10) Patent No.: US 8,847,412 B2
(45) Date of Patent: Sep. 30, 2014

(54) MICROELECTRONIC ASSEMBLY WITH THERMALLY AND ELECTRICALLY CONDUCTIVE UNDERFILL

(71) Applicant: Invensas Corporation, San Jose, CA (US)

(72) Inventors: Belgacem Haba, Saratoga, CA (US); Simon McElrea, Scotts Valley, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/672,750

(22) Filed: Nov. 9, 2012

(65) Prior Publication Data

US 2014/0131900 A1    May 15, 2014

(51) Int. Cl.
*H01L 23/488* (2006.01)
*H01L 21/56* (2006.01)
(Continued)

(52) U.S. Cl.
CPC ....... *H01L 21/56* (2013.01); *H01L 2224/81455* (2013.01); *H01L 2224/32145* (2013.01);
(Continued)

(58) Field of Classification Search
USPC ......... 257/777, 778, 780, 723, 686, 738, 734, 257/770, E23.125, E25.011, E23.013
See application file for complete search history.

(56) References Cited

U.S. PATENT DOCUMENTS 4,323,914 A    4/1982    Berndlmaier et al.
5,261,593 A *  11/1993   Casson et al. ............ 228/180.22
(Continued)

FOREIGN PATENT DOCUMENTS

WO    2012053321 A1    4/2012

OTHER PUBLICATIONS

Suryanarayana et el., "Repairability of underfill encapsulated flip-chip packages", Proc. 45th IEEE Electr. Comp. Technol. Conf. (Las Vegas, NV) pp. 524-528 May 1995.

(Continued)

*Primary Examiner* — Alexander Oscar Williams
(74) *Attorney, Agent, or Firm* — Lerner, David, Littenberg, Krumholz & Mentlik, LLP

(57) ABSTRACT

A microelectronic assembly may include a microelectronic element having a surface and a plurality of contacts at the surface; a first element consisting essentially of at least one of semiconductor or dielectric material, the first element having a surface facing the surface of the microelectronic element and a plurality of first element contacts at the surface of the first element; electrically conductive masses each joining a contact of the plurality of contacts of the microelectronic element with a respective first element contact of the plurality of first element contacts; a thermally and electrically conductive material layer between the surface of the microelectronic element and the surface of the first element and adjacent conductive masses of the conductive masses; and an electrically insulating coating electrically insulating the conductive masses and the surfaces of the microelectronic element and the first element from the thermally and electrically conductive material layer.

14 Claims, 5 Drawing Sheets

(51) Int. Cl.
*H01L 23/00* (2006.01)
*H01L 23/373* (2006.01)
*H01L 23/552* (2006.01)
*H01L 23/498* (2006.01)
*H01L 23/31* (2006.01)
*H01L 25/065* (2006.01)
*H01L 23/29* (2006.01)

(52) U.S. Cl.
CPC ............. H01L 2224/83192 (2013.01); H01L 2224/2929 (2013.01); H01L 2224/0401 (2013.01); H01L 2224/8192 (2013.01); H01L 2224/05624 (2013.01); H01L 24/14 (2013.01); H01L 23/295 (2013.01); H01L 2224/83104 (2013.01); H01L 23/3737 (2013.01); H01L 2224/81207 (2013.01); H01L 2224/81801 (2013.01); H01L 24/29 (2013.01); H01L 24/83 (2013.01); H01L 24/81 (2013.01); H01L 2224/81447 (2013.01); H01L 23/552 (2013.01); H01L 2224/16145 (2013.01); H01L 23/498 (2013.01); H01L 2224/05571 (2013.01); H01L 2224/81805 (2013.01); H01L 2224/73204 (2013.01); H01L 2224/14051 (2013.01); H01L 21/563 (2013.01); H01L 23/3135 (2013.01); H01L 23/3185 (2013.01); H01L 24/32 (2013.01); H01L 24/73 (2013.01); H01L 2224/29339 (2013.01); H01L 2224/81191 (2013.01); H01L 2224/13082 (2013.01); H01L 24/92 (2013.01); H01L 2224/81444 (2013.01); H01L 2224/05568 (2013.01); H01L 2224/131 (2013.01); H01L 24/16 (2013.01); H01L 25/0657 (2013.01); H01L 2224/05647 (2013.01); H01L 2224/32225 (2013.01); H01L 23/488 (2013.01); H01L 2224/1403 (2013.01); H01L 2224/16227 (2013.01); H01L 23/3128 (2013.01); H01L 24/13 (2013.01)
USPC ............. 257/786; 257/E23.125; 257/E25.01; 257/E23.013; 257/777; 257/686; 257/723; 257/778; 257/685; 257/737; 257/734; 257/770

(56) References Cited

U.S. PATENT DOCUMENTS

| | | | |
|---|---|---|---|
| 5,274,913 A * | 1/1994 | Grebe et al. | 29/840 |
| 5,371,404 A | 12/1994 | Juskey et al. | |
| 5,405,808 A | 4/1995 | Rostoker et al. | |
| 5,424,097 A | 6/1995 | Olson et al. | |
| 5,633,535 A * | 5/1997 | Chao et al. | 257/778 |
| 5,978,222 A | 11/1999 | Iijima et al. | |
| 6,165,885 A * | 12/2000 | Gaynes et al. | 438/612 |
| 6,265,776 B1 * | 7/2001 | Gilleo | 257/738 |
| 6,297,562 B1 * | 10/2001 | Tilly | 257/780 |
| 6,354,485 B1 * | 3/2002 | Distefano | 228/179.1 |
| 6,461,890 B1 * | 10/2002 | Shibata | 438/106 |
| 6,828,674 B2 * | 12/2004 | Karpman | 257/711 |
| 6,885,522 B1 * | 4/2005 | Kira et al. | 360/244.1 |
| 7,098,542 B1 * | 8/2006 | Hoang et al. | 257/778 |
| 7,215,018 B2 | 5/2007 | Vindasius et al. | |
| 7,393,770 B2 | 7/2008 | Wood et al. | |
| 7,732,904 B2 | 6/2010 | Fjelstad et al. | |
| 7,919,846 B2 | 4/2011 | Hembree | |
| 8,138,019 B2 | 3/2012 | Yoon et al. | |
| 8,313,521 B2 * | 11/2012 | Ruane et al. | 623/1.11 |
| 2007/0215377 A1 * | 9/2007 | Aoki | 174/250 |
| 2008/0036097 A1 | 2/2008 | Ito et al. | |
| 2009/0267213 A1 | 10/2009 | Lin et al. | |
| 2010/0052157 A1 | 3/2010 | Pratt | |
| 2010/0164083 A1 | 7/2010 | Yim | |
| 2011/0115099 A1 | 5/2011 | Karnezos | |
| 2011/0272825 A1 | 11/2011 | McGrath et al. | |
| 2011/0309481 A1 | 12/2011 | Huang et al. | |
| 2012/0193779 A1 | 8/2012 | Lee et al. | |

OTHER PUBLICATIONS

Puttlitz et al., "Area Array Interconnection Handbook", p. 492, Kluwer Academic Publishers, Sep. 1, 2011.
International Search Report and Written Opinion for Application No. PCT/US2013/069319 dated Jul. 2, 2014.

* cited by examiner

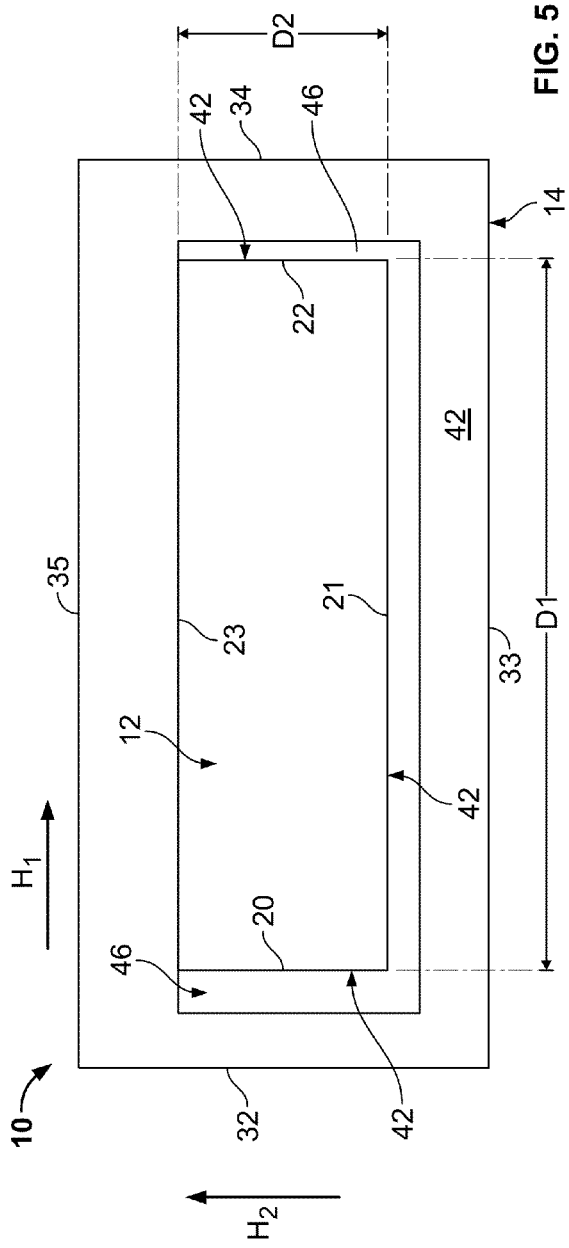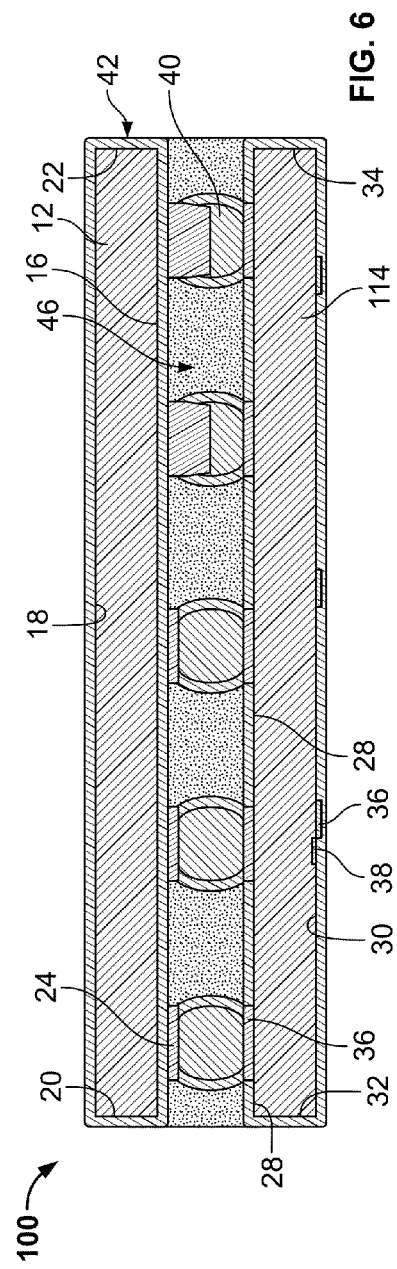

MICROELECTRONIC ASSEMBLY WITH THERMALLY AND ELECTRICALLY CONDUCTIVE UNDERFILL

FIELD OF THE INVENTION

The present invention relates to microelectronic assemblies and, in particular, packaging of a microelectronic assembly.

BACKGROUND OF THE INVENTION

Microelectronic elements such as semiconductor chips commonly are provided with elements which protect the microelectronic element and facilitate its connection to other elements of a larger circuit. For example, a semiconductor chip typically is provided as a small, flat element having oppositely facing front and rear surfaces and contacts at the front surface. The contacts are electrically connected to the numerous electronic circuit elements formed integrally within the chip.

Advances in semiconductor chip design and manufacture have led to semiconductor chips having higher densities and larger numbers of contacts. Such contacts on the chip may be joined by electrically conductive masses to conductive elements on a facing surface of another element, which may be another semiconductor chip, substrate, microelectronic package or microelectronic assembly including a semiconductor chip. As a result, a large number and high density of contacts of a chip, and a large number of conductive masses joined to such contacts and a corresponding large number of conductive elements of another element may be disposed in a relatively small region, such that a large amount of heat may be generated during operation of a device including the chip and the other element, which may be within a microelectronic package. Such heat typically needs to be dissipated to avoid damage to the chip and other elements in device. A circuit board, to which a semiconductor chip or the microelectronic package is typically joined, usually serves as a heat sink that dissipates heat generated during operation of a device. However, with the microelectronic packages used in electronic devices becoming smaller and smaller, the number of thermal paths existing in the microelectronic packages over which the heat generated may be transferred for dissipation, such as through heat sinks at the circuit board, is decreasing.

In certain microelectronic packages, a semiconductor chip is mounted in a so-called flip-chip orientation, so the contacts on a front surface may be joined by electrically conductive masses with conductive elements on a facing surface of another element. With increases in the density of the contacts on such chips, the contacts of the chip have smaller and smaller pitches. The smaller pitches may, in turn, result in increased electrical interference between electrical paths extending from the chip to another element adjacent to and electrically connected with the chip, which may impact operation of an electronic device including such chip.

Despite the considerable effort devoted in the art to the development of microelectronic packages with one or more semiconductor chip, further improvement would be desirable.

SUMMARY OF THE INVENTION

In accordance with one embodiment, a microelectronic assembly may include a microelectronic element having a surface and a plurality of contacts at the surface; a first element consisting essentially of at least one of semiconductor or dielectric material, the first element having a surface facing the surface of the microelectronic element and a plurality of first element contacts at the surface of the first element; electrically conductive masses each joining a contact of the plurality of contacts of the microelectronic element with a respective first element contact of the plurality of first element contacts; a thermally and electrically conductive material layer between the surface of the microelectronic element and the surface of the first element and adjacent conductive masses of the conductive masses; and an electrically insulating coating electrically insulating the conductive masses and the surfaces of the microelectronic element and the first element from the thermally and electrically conductive material layer.

In another embodiment, a method for fabricating a microelectronic assembly may include providing a microelectronic element having a surface and a plurality of contacts exposed at the surface, the contacts respectively joined by electrically conductive masses with first element contacts at a surface of a first element facing the surface of the microelectronic element, the first element consisting essentially of at least one of semiconductor or dielectric material. In addition, the method may include providing an electrically insulating coating to the electrically conductive masses and the surfaces; and providing a thermally and electrically conductive material layer between the surface of the microelectronic element and the surface of the first element and adjacent conductive masses of the conductive masses.

In another embodiment, a method for fabricating a microelectronic assembly may include providing a first unpackaged semiconductor chip having a first surface opposite a second surface and a plurality of first contacts at the first and second surfaces, the contacts at the first surface respectively joined by first electrically conductive masses with contacts at a surface of a second unpackaged semiconductor chip facing the first surface, the contacts at the second surface of the first unpackaged semiconductor chip respectively joined by second electrically conductive masses with contacts at a surface of a third unpackaged semiconductor chip facing the second surface of the first unpackaged semiconductor chip. In addition, the method may include providing an electrically insulating coating to: the first electrically conductive masses, the first surface of the first unpackaged semiconductor chip, and the surface of the second unpackaged semiconductor chip to define a first region between the first surface of the first unpackaged semiconductor chip and the surface of the second unpackaged semiconductor chip and adjacent first electrically conductive masses of the first electrically conductive masses; and the second electrically conductive masses, the second surface of the first unpackaged semiconductor chip and the surface of the third unpackaged semiconductor chip to define a second region between the second surface of the first unpackaged semiconductor and the surface of the third unpackaged semiconductor chip, and adjacent second electrically conductive masses of the second electrically conductive masses. Further, the method may include providing the first and second regions with respective first and second thermally and electrically conductive layers.

BRIEF DESCRIPTION OF THE DRAWINGS

FIG. 5 is a top plan view of the microelectronic assembly of FIG. 4.

FIG. 6 is a diagrammatic sectional view depicting a microelectronic assembly, in accordance with another embodiment of the disclosure.

DETAILED DESCRIPTION

A microelectronic assembly 10 including a microelectronic element 12, such as a semiconductor chip, joined with another element 14, such as a substrate consisting essentially of dielectric or semiconductor material, or another microelectronic element, may be fabricated in accordance with an embodiment of the disclosure, as shown in FIGS. 1-4. The elements 12 or 14 may be an unpackaged or packaged semiconductor chip, and such semiconductor chip may embody a plurality of active devices (e.g., transistors, diodes, etc.), a plurality of passive devices (e.g., resistors, capacitors, inductors, etc.), or both active devices and passive devices. In a particular embodiment, the semiconductor chip may be configured to have a predominant function as a logic chip, e.g., a programmable general or special purpose processor, a microcontroller, a field programmable gate array ("FPGA") device, an application specific integrated circuit ("ASIC"), a digital signal processor, among others. In such embodiment, one or more other chips in the microelectronic assembly may be configured to have a predominant function other than as a logic chip. For example, one or more logic chips may be combined with one or more storage array chips having predominant memory function in a "system in a package" ("SIP") configuration. Such memory storage array chip may include a volatile memory storage area, e.g., dynamic random access memory ("DRAM"), static random access memory ("SRAM"), a nonvolatile memory storage array such as flash memory or magnetic random access memory ("MRAM"), or a combination of volatile and nonvolatile storage arrays. In a particular embodiment, a "system on a chip" ("SOC") which combines logic function and substantial other function, e.g., substantial memory function, on the same chip, may be combined with one or more additional chips in the microelectronic assembly 10.

Figure 1:
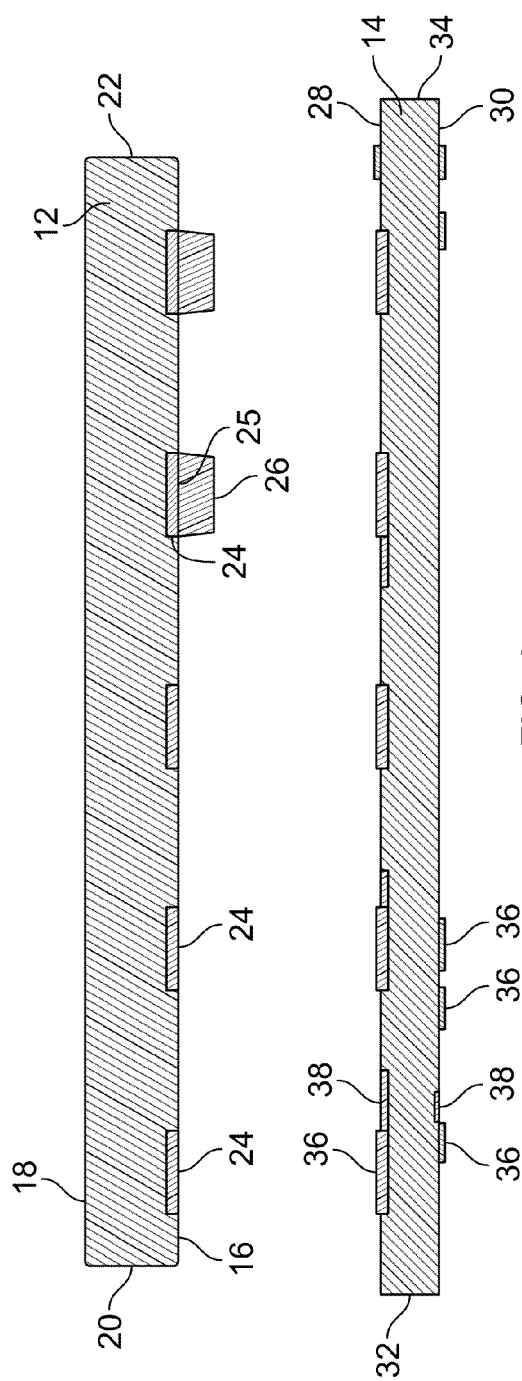
FIG. 1 is a diagrammatic sectional view depicting a step in a process for manufacturing a microelectronic assembly, in accordance with an embodiment of the disclosure.

Referring to FIG. 1, the microelectronic element 12 may be configured to be joined with a substrate 14 including dielectric material. The microelectronic element 12 may have a front surface 16, a rear surface 18 opposite the front surface 16, opposing first and second edges 20 and 22 extending between the front and rear surfaces 16, 18, and opposing third and fourth edges 21 and 23 extending between the front and rear surface surfaces 16, 18, where the edges 21, 23 are transverse and may be orthogonal to the edges 20, 22 (see FIG. 5). Element or chip contacts 24 are at the front surface 16 of the microelectronic element 12, and may be electrically connected to circuitry or other conductive elements (not shown) within the microelectronic element 12. The contacts 24 desirably may be arranged as an array on the surface 16, in which the contacts are spaced from each other at a very fine pitch, which in some examples is typically 10-80 microns.

As used in this disclosure, a statement that an electrically conductive element is "at" a surface of a microelectronic element, such as at a surface that forms a top or front surface of a semiconductor chip, indicates that, when the semiconductor chip is not assembled with any other element, the electrically conductive element is available for contact with a theoretical point moving in a direction perpendicular to the surface of the chip towards the surface of the chip from outside the chip. Thus, a terminal or other conductive element which is at a surface of a chip may project from such surface; may be flush with such surface; or may be recessed relative to such surface in a hole or depression in the chip. In addition, as used in this disclosure a statement that an electrically conductive element is "at" a surface of a substrate, a circuit panel or like element indicates that, when the substrate, circuit panel or like element is not assembled with any other element, the electrically conductive element is available for contact with a theoretical point moving in a direction perpendicular to the surface of the substrate, circuit panel or like element toward the surface of the substrate, circuit panel or like element from outside the substrate, circuit panel or like element.

The contacts 24 may include aluminum or copper. A front surface 25 of the contact 24 remote and facing away from the front surface 16 of the chip may be covered with a metal or other electrically conductive material. In one embodiment, electrically conductive material shaped in the form of a post 26 may extend from the contact 24 in a direction away from the surface 16.

Still referring to FIG. 1 and also to FIG. 5, the substrate 14 may include a front surface 28, a rear surface 30 opposite the front surface 28, opposing first and second edges 32 and 34 extending between the front and rear surfaces 28, 30, and opposing third and fourth edges 33 and 35 extending between the front and rear surface surfaces 28, 30, where the edges 32, 34 are transverse and may be orthogonal to the edges 33, 35. Conductive elements of the element 14, which include pads 36 and traces 38 extending from the pads 36, may be patterned onto the surface 28. In addition, the conductive elements of the element 14 may include traces 38 extending from conductive elements 36 that are terminals or pads 36 patterned on the surface 30. The conductive elements 36 at the surfaces 28 and 30 may be electrically connected with each other through other conductive elements (not shown) within the substrate. The traces 38 may be formed as elongated strips of a conductive material, preferably a solid metal such as copper, gold, nickel, and combinations thereof, on the surfaces 28 and 30.

In one embodiment, each of the surface 28 and 30 of the substrate 14 may be plated, masked and selectively etched to form the traces, pads and terminals. Alternatively, the surfaces 28 and may be covered with a mask material, and then selectively exposed to laser radiation to cut grooves through the mask. A seed layer can be applied over the mask and into the grooves, whereupon the mask is removed so as to lift off the seed layer everywhere except at the grooves. The surface is then exposed to a plating bath, so that metal is deposited only at the grooves where the seed is present. Any other technique for forming metallic features on a dielectric body can be used.

In one embodiment, the dielectric material of the substrate 14 may be inorganic, such as an oxide or nitride.

With the microelectronic element 12 positioned over the substrate 14 (referring to FIG. 2), the contacts 24 and the conductive material 26 covering the contacts 24 are joined with the pads 36 at the surface 28 of the substrate 14, which are patterned to correspond to the positions of the contacts 24 on the surface 16, by any suitable electrically conductive mass 40, which electrically connects the contacts 24 respectively with the pads 36. The mass 40 may be a solder element or solder bond. Merely by way of example, such bonds may be formed by soldering, eutectic bonding thermosonic bonding or the like. The bonding materials may be carried on the contacts 24, the pads 36 or the conductive material 26. In such embodiment, the microelectronic element 12 is arranged in a flip-chip orientation so the front surface 16 including the contacts 24 of the element 12, which is a semiconductor chip, faces toward the surface 28 of the substrate 14 of the assembly 10, where the surface 28 includes the pads 36 to which the contacts 24 are joined.

Figure 3:
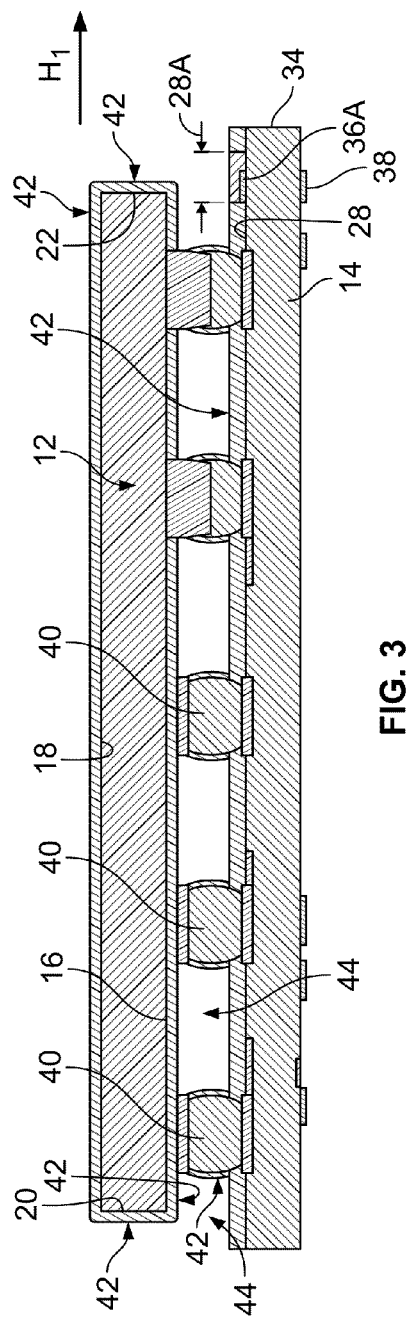
FIG. 3 is a diagrammatic sectional view depicting a later stage in the process for manufacturing a microelectronic assembly, in accordance with an embodiment of the disclosure.

Referring to FIGS. 3 and 5, electrically insulating material may be provided as an electrically insulating coating 42 to the conductive masses 40, the surfaces 16 and 18 and the edges 20, 21, 22, 23 of the microelectronic element 12, and the surface 28 of the substrate 14. The coating 42 may be in the form of a conformal coating having a thickness of about one micron, and in some embodiments a maximum thickness of about two microns. In some embodiments, the coating 42 may conform to contours of the masses 40, the surfaces 16 and 18 and the edges 20, 21, 22, 23 of the microelectronic element 12, and the surface 28 of the substrate 14. The coating 42 may define a region 44 between the surface 16 of the microelectronic element 12 and the surface 28 of the substrate 14 and adjacent ones of the conductive masses 40.

In one embodiment, the insulating material of the coating 42 may include poly-p-xylene or parylene, and form a pinhole free conformal coating on the masses 40, the surfaces 16 and 18 and the edges 20, 21, 22, 23 of the microelectronic element 12, and the surface 28 of the substrate 14.

Figure 2:
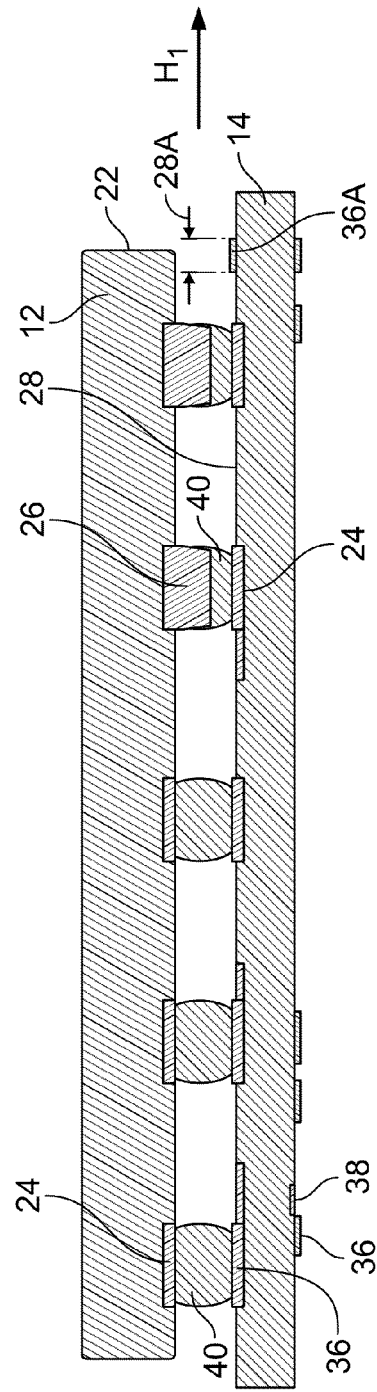
FIG. 2 is a diagrammatic sectional view depicting a later stage in the process for manufacturing a microelectronic assembly, in accordance with an embodiment of the disclosure.

In one embodiment, a structure of the microelectronic element 12 joined with the substrate 14 by the conductive masses 40, such as obtained following the stage of manufacture shown in FIG. 2, may be arranged in a chamber, and the coating 42 may be provided by flowing a gas including a precursor of poly-p-xylene at a temperature of less than 200 degree C. In another embodiment, silane may be flowed into the chamber in which the structure of the element 12 joined with the substrate 14 is arranged, prior to flowing a gas including a precursor of poly-p-xylene into the chamber to form the coating 42.

Figure 4:
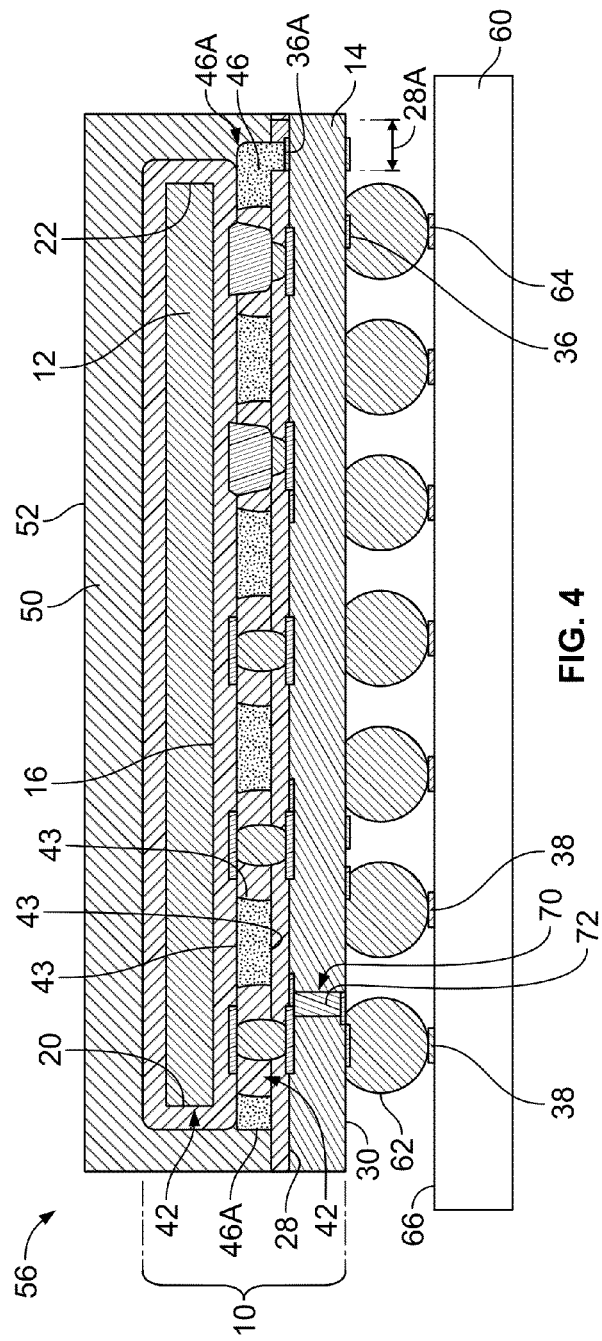
FIG. 4 is a diagrammatic sectional view depicting a microelectronic assembly manufactured using the process of FIGS. 1-3 joined with an external component, in accordance with an embodiment of the disclosure.

Referring to FIG. 4, a thermally and electrically conductive material layer 46 may be provided in the region 44 as underfill, such that the layer 46 is between the surface 16 of the microelectronic element 12 and the surface 28 of the substrate 14 and also between the adjacent conductive masses 40. The layer 46 may include conductive adhesives, such as silver-filled epoxy. In one embodiment, the insulating coating 42 coats at least the conductive masses 40, the surface 16 of the microelectronic element 12 and the surface 28 of the substrate 14 to electrically insulate the masses 40 and the surfaces 16 and 28 from the conductive material layer 46.

In one embodiment, referring to FIG. 4, portions of the conductive layer 46 may extend along surfaces 43 of the coating 42 facing the region 44. Such portions of the layer 46 may serve as a thermal path(s) that, during operation of a device including the assembly 10, transfer heat away from the surface 16 of the microelectronic element and electrical paths, which extend from the contacts 24, through the conductive masses 40 and to the pads 36 and generate heat when electrical current flows therethrough during operation of the device.

In some embodiments, the layer 46 may occupy the entirety of the region 44. In another embodiment as shown in FIGS. 4 and 5, the surfaces 16 and 18 may extend a distance D1 in a horizontal direction H1 from the edge 20 to the edge 22 and a distance D2 in a horizontal direction H2 from the edge 21 to the edge 23, where the horizontal directions H1 and H2 are orthogonal to each other. In one embodiment, the layer 46 may occupy the entirety of the region and extend away from the region 44 at the edge 22 in the direction H1 to overlie a surface portion 28A of the surface 28 at which the microelectronic element 12 does not overlie the surface 28. In other words, the layer 46 may extend from the region 44 at the edge 22 of the microelectronic element 12, toward the edges 34 of the substrate 14, such that a portion of the layer 46 is not between the element 12 and the substrate 14. As shown in FIG. 5, the layer 46 may extend away from the region 44 at the edge 20, in a direction opposite to H1 towards the edge 32, and also away from the region 44 at the edge 21 in a direction opposite to H2 towards the edge 33.

In one embodiment, the conductive material layer 46 may overlie a portion of the surface 16 of the microelectronic element 12 coextensive with the array of the contacts 24.

In a further embodiment, referring to FIG. 2, a conductive element 36A at the portion 28A of the surface 28, which portion 28A extends in the direction H1 away from the edge 22, may be suitably masked prior to providing of the insulating coating 42, as described above. The insulating coating 42 is provided with the portion 28A masked, and then the mask is removed such that the portion 28A, including the conductive element 36A at the portion 28A, is not covered with the coating 42 (the absence of the coating over the portion 28A in such embodiment is shown as cross-hatching in FIG. 3). The layer 46 may then be provided to the region 44, and also to extend from the region 44 at the edge 22 in the direction H1 towards the edge 34 of the substrate 14 along the surface portion 28A and contact with the conductive element 36A at the surface portion 28A (the portion of the layer 46 electrically connecting with the conductive element 36A is shown as a shaded region in FIG. 4). The conductive element 36A may be electrically connected, through a trace 38 of or electrical circuitry within the substrate 14, with a terminal 36 at the surface 28 or 30 of the substrate 14 configured to be electrically connected with a predetermined potential, such as a ground potential.

In another embodiment, the conductive material layer 46 may include material to provide electrical resistivity and dielectric strength that is sufficiently high for expected operation of the microelectronic assembly 10, so that electrical interference between electrical paths of the assembly 10 may be avoided. In one embodiment, the material includes silver-filled epoxy containing a quantity of silver adapted to provide that the layer 46 has a desired electrical resistivity.

In some embodiments, the substrate 14 may include vias 70 and conductors 72 disposed in the vias 70, which are formed in the substrate 14 before the substrate is joined with the microelectronic element 12 such as described above with reference to FIG. 2. The conductors 72 are arranged within the substrate 14 to electrically connect pads or traces at the surface 28 with traces or terminals at the surface 30 of the substrate 14.

In one embodiment, the substrate 14 may include dielectric material that is inorganic, such as an oxide or nitride. In such embodiment, openings 70 at desired locations in the substrate 14 may be formed, such as at the stage of the manufacturing process shown in FIG. 1 or prior to such stage, by applying a photoresist layer (not shown) on the layer 28, selectively removing portions of the photoresist layer to uncover selected portions of the surface 28, and then etching the uncovered dielectric layer regions to form the openings 70, as shown in FIG. 4. It is to be understood that any conventional photolithography technique may be used to selectively form openings in the dielectric material of the substrate extending from the surface 28 to the surface 30. In one embodiment, the openings in the substrate may be formed by ablating, such as using a laser or punching, and a photoresist layer is not applied. In another embodiment, where the dielectric material of the substrate includes a photosensitive material, a photosensitive material of the type commonly used as a solder mask on electronic components, the openings may be formed by photographically.

Referring again to FIG. 4, after the layer 46 is applied, a planarized encapsulant 50 may be formed over the surface 18, the edges 20 and 22, and uncovered portions of the surface 28 extending away from region 44 at the edges 20, 21, 22 and 23 of the microelectronic element 12, such that the encapsulant 50 contacts uncovered portions of the coating 42, uncovered portions of the surfaces and edges of the element 12, the uncovered portions of the surface 28 and also any uncovered surface portions 46A of the layer 46. The encapsulant 50 desirably encapsulates each uncovered portion of the coating 42, and also the thermally and electrically conductive material layer 46. The encapsulant 50 typically surrounds the edges 20, 21, 22, 23 of the microelectronic element and the surface portions 46A. The encapsulant 50 with the microelectronic element 12 embedded therein forms a molded structure that is a microelectronic package 56. The encapsulant 50, which protects the encapsulated electrical components, such as the contacts of the microelectronic element 12, the conductive elements of the substrate 14 and the conductive masses 40, from the external environment, may include dielectric material or resin with insulating properties. In one embodiment, the encapsulant may be formed by a molding process that forms a planar surface 52 spaced from and parallel to the surface 18 of the microelectronic element 12 and the surface 28 of the substrate 14. The planar surface 52 may extend away from the region 44 at the edges 20, 21, 22 and 23 of the microelectronic element 12.

In a further embodiment, the microelectronic package 56 formed from the microelectronic assembly 10, as discussed above, may be joined to an external component 60, such as a printed circuit board, a microelectronic package, a microelectronic assembly or another substrate of dielectric material, by electrically connecting solder elements 62, such as solder balls, formed at the terminals 38 at the surface 30 of the substrate 14 with conductive elements 64 on a facing surface 66 of the board 60 arranged in a pattern corresponding to that of the terminals 38 at the surface 30.

In another embodiment, referring to FIG. 6, a microelectronic assembly 100 may have a construction similar to the microelectronic assembly 10 discussed above, except that the element 14 is replaced by a microelectronic element 114 that is an unpackaged semiconductor chip. Reference numbers identical to those used to describe the assembly 10 are used below to identify the same or similar components in the assembly 100. The assembly 100, similar to the assembly 10, includes the contacts 24 at the surface 16 of the microelectronic element 12 joined by electrically conductive masses 40 to pads 36 at the surface 28 of the microelectronic element 114. In addition, the insulating coating 42 may be provided to the surfaces 16, 18 and the edges 20, 21, 22, 23 of the microelectronic element 12, the conductive masses 40, and the surfaces 28, 30 and the edges 32, 33, 34, 35 of the microelectronic element 114, such that the microelectronic elements 12 and 114 and the conductive masses 40 are electrically insulated. Further, the thermally and electrically conductive material layer may be provided between the surfaces 16 and 28 and between adjacent conductive masses 40, similarly as in the assembly 10.

The microelectronic element 114 further may include pads or terminals 36 and traces 38 extending from the pads or terminals 36 at the surface 30 thereof. In one embodiment, the surface 30 includes terminals 36 configured to be joined by solder elements to conductive elements at a facing surface of an external component (not shown), similarly as shown in FIG. 4.

Figure 7:
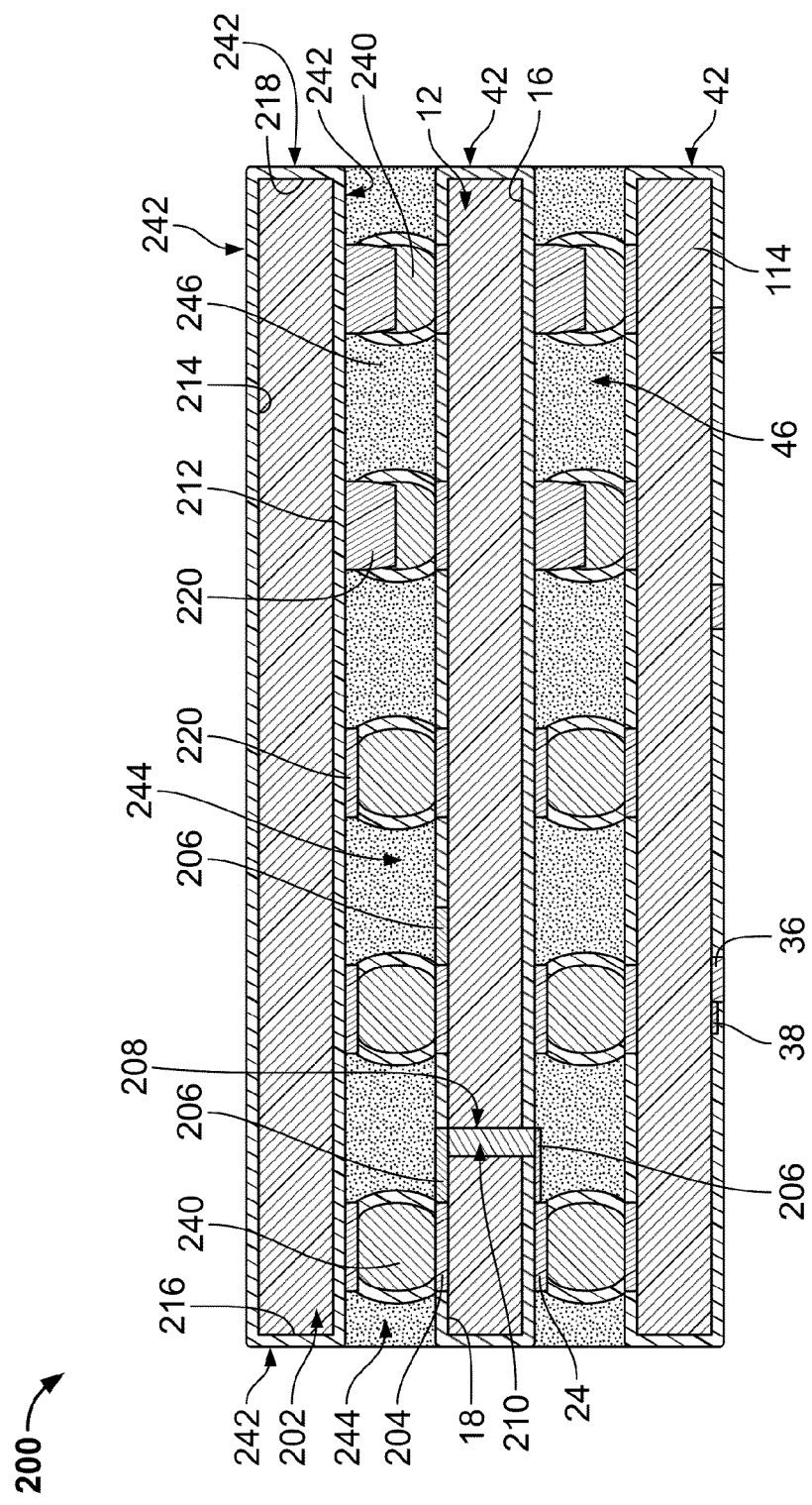
FIG. 7 is a diagrammatic sectional view depicting a microelectronic assembly, in accordance with another embodiment of the disclosure.

In still another embodiment, referring to FIG. 7, a microelectronic assembly 200 may have a construction similar to the microelectronic assembly 100 as discussed above and include an additional microelectronic element 202 which is an unpackaged semiconductor chip joined with the microelectronic element 12, such that the elements 202, 12 and 114 are in a stacked arrangement. Reference numbers identical to those used to describe the assembly 100 are used below to identify the same or similar components in the assembly 200. In the assembly 200, the microelectronic element 12 may include pads 204 and traces 206 extending from pads 204 at the surface 18, and traces 206 extending from contacts 24 at the surface 16. In addition, the traces 206 of the microelectronic element 12 may be electrically connected to electronic circuitry (not shown) within the element 12 electrically connected with the pads 204, other traces 206 and the contacts 24. In one embodiment, the microelectronic element 12 may include one or more through silicon vias 208 and conductors 210 disposed respectively in the via 208s that electrically connect traces 206 at the surface 18 with the traces 206 at the surface 16.

The microelectronic element 202 has a construction similar to the microelectronic element 12, and may have a front surface 212, a rear surface 214 opposite the front surface 212, opposing first and second edges 216 and 218 extending between the front and rear surfaces 212, 214, and opposing third and fourth edges (not shown) extending between the front and rear surface surfaces 212, 214, where the edges 216, 218 are transverse and may be orthogonal to the other edges. Element or chip contacts 220 are at the front surface 212 of the microelectronic element 202, and may be electrically connected to circuitry within or other conductive elements of (not shown) the microelectronic element 202. The contacts 220 desirably may be arranged as an array on the surface 212, in which the contacts 220 are spaced from each other at a very fine pitch, as described above for the contacts 24 of the microelectronic element 12.

The microelectronic element 202 is positioned over the microelectronic element 12, and the contacts 220 are joined with the pads 204 at the surface 18 of the microelectronic element 12 by electrically conductive masses 240, which are similar to the masses 40 and electrically connect the contacts 220 with the pads 204. As such, the element 202 is arranged in a flip-chip orientation with the contacts 220 facing the surface 18 of the microelectronic element 12.

Electrically insulating material may be provided as an electrically insulating coating 242 to the conductive masses 240, the surfaces 212 and 214 and all of the edges of the microelectronic element 212, where the coating 242 covers and conforms to contours of the surfaces and edges of the element 212 in a manner similar to that described above concerning the coating 42 covering surface and edges of the element 12. The coating 242 may define a region 244 between the surface 212 of the microelectronic element 202 and the surface 18 of the element 12 and adjacent ones of the conductive masses 240. A thermally and electrically conductive material layer 246 may be provided as underfill in the region 244, where the layer 246 is between the surface 212 of the microelectronic element 202 and the surface 18 of the element 12 and the adjacent conductive masses 240. Similarly as discussed above and shown in FIG. 4, the microelectronic element 114 of the assembly 210 may include terminals 36 configured to be joined by solder elements to conductive elements at a facing surface of an external component (not shown).

In one embodiment, the conductive layers 246 and 46 may be electrically connected to each other through conductive elements of the microelectronic element 12 and also electrically connected to a terminal of the assembly 200, such as at the surface 30 or the surface 214, configured for electrical connection to a predetermined potential, such as a ground potential.

In another embodiment, the assembly 200 may be manufactured by joining the element 12 to the element 114 and 212, in any order, by way of the conductive masses 40 and 240, respectively, and an electrically insulating coating may be provided as a coating layer 42 of the assembly 200 as described above in a single manufacturing step, such that a single layer of a same electrically insulation material forms the electrically insulating coating 42. In another embodiment, after the electrically insulating coating is provided for the assembly 200, the regions 44 and 244 may be provided with a thermally and electrically conductive layer at a same time or different times. In some embodiments, the thermally and electrically conductive layer in the regions 44 and 244 may be portions of a single continuous mass of thermally and electrically conductive material.

In some embodiments, the assembly 200 may fabricated to include a plurality of microelectronic elements 242 stacked one on top of the other over the microelectronic element 12, where adjacent ones of the elements 242 have a similar structure, including a thermally and electrically conductive material between an electrically insulating coating on the facing surfaces of the adjacent elements 242 and conductive masses joining the adjacent elements, and have similar electrical connections therebetween and to an adjacent element in the stack, as described above for the adjacent microelectronic elements 214 and 12. In some embodiments, the disclosure of the invention may be applied to such stacked arrangements as chip on package, for example, with the surface 30 of the assembly 100 facing the surface 18 of the package 56, and package-on-package, for example, with the surface 30 of the substrate of a first microelectronic package 56 facing the surface 30 of the substrate of a second microelectronic package 56.

Figure 8:
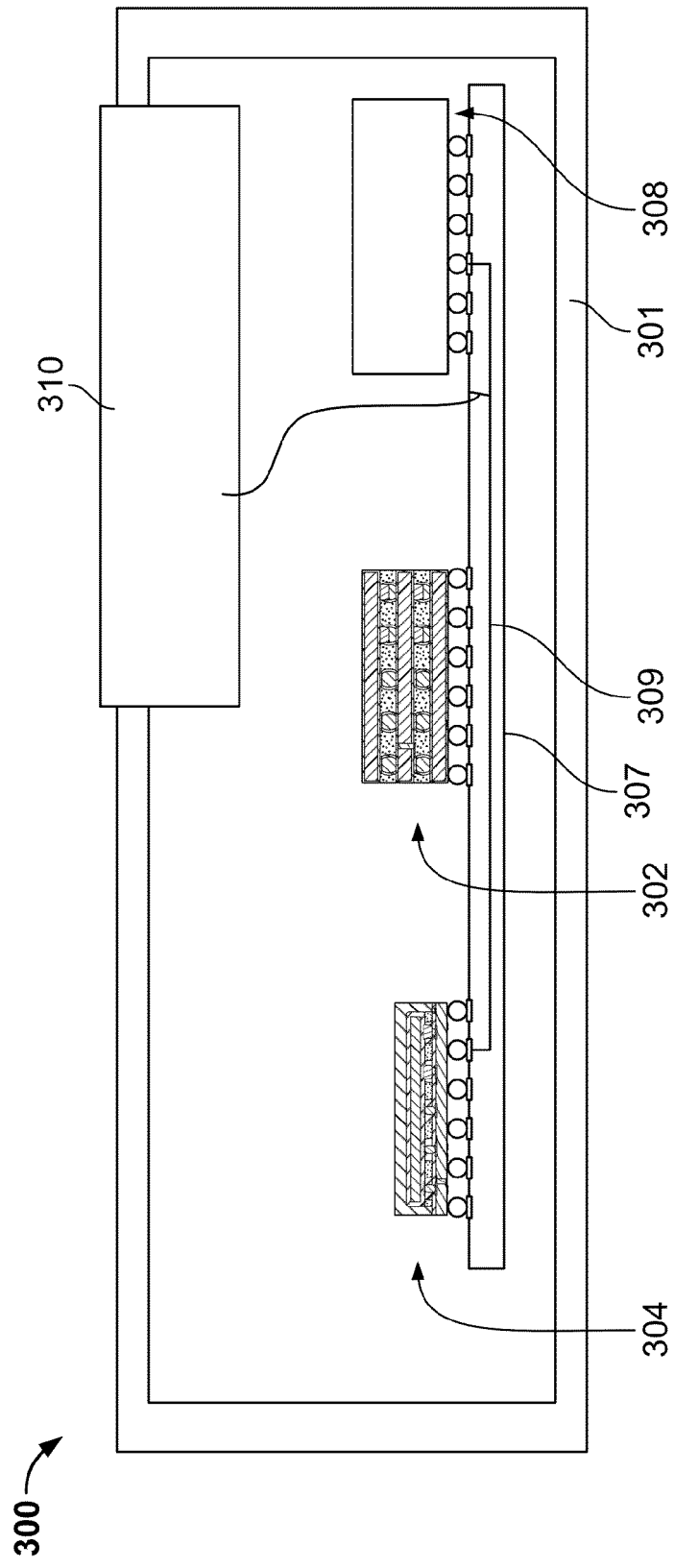
FIG. 8 is a diagrammatic view depicting a system, in accordance with an embodiment of the disclosure.

The assemblies discussed above can be utilized in construction of diverse electronic systems. For example, a system 300 (FIG. 8) in accordance with a further embodiment of the invention includes a first package assembly 302, such as the assembly 200, and a second package assembly 304, such as the microelectronic package 56, in conjunction with other electronic components 308 and 310. In the example depicted, component 308 is a semiconductor chip whereas component 310 is a display screen, but any other components can be used. Of course, although only two additional components are depicted in FIG. 8 for clarity of illustration, the system may include any number of such components. Package assemblies 302 and 304 and components 308 and 310 are mounted to a common housing 301, schematically depicted in broken lines, and are electrically interconnected with one another as necessary to form the desired circuit. In the exemplary system shown, the system includes a circuit panel 307 such as a flexible or rigid printed circuit board, and the circuit panel includes numerous conductors 309, of which only one is depicted in FIG. 8, interconnecting the components with one another. An off-board connector (not shown) connects component 310 to the circuit panel. However, this is merely exemplary; any suitable structure for making electrical connections can be used. The housing 301 is depicted as a portable housing of the type usable, for example, in a cellular telephone or personal digital assistant, and screen 310 is exposed at the surface of the housing. Again, the simplified system shown in FIG. 8 is merely exemplary; other systems, including systems commonly regarded as fixed structures, such as desktop computers, routers and the like can be made using the packages discussed above.

As these and other variations and combinations of the features discussed above can be utilized without departing from the present invention, the foregoing description of the preferred embodiments should be taken by way of illustration rather than by way of limitation of the invention as defined by the claims.

The invention claimed is:

1. A microelectronic assembly comprising:
a microelectronic element having a surface and a plurality of contacts at the surface;
a first element consisting essentially of at least one of semiconductor or dielectric material, the first element having a surface facing the surface of the microelectronic element and a plurality of first element contacts at the surface of the first element;
electrically conductive masses each joining a contact of the plurality of contacts of the microelectronic element with a respective first element contact of the plurality of first element contacts;
a thermally and electrically conductive material layer external to and facing the conductive masses between the surface of the microelectronic element and the surface of the first element and adjacent conductive masses of the conductive masses; and
an electrically insulating coating provided to the conductive masses and the surfaces of the microelectronic element and the first element and facing the thermally and electrically conductive material layer to electrically insulate the conductive masses and the surfaces of the microelectronic element and the first element from the thermally and electrically conductive material layer.

2. The assembly of claim 1,
wherein the contacts at the surface of the microelectronic element are arranged at locations of an area array, and
wherein the conductive material layer overlies a portion of the surface of the microelectronic element coextensive with the area array.

3. The assembly of claim 1,
wherein the microelectronic assembly is a microelectronic package, the first element is a substrate having terminals configured for electrically connecting the microelectronic package with a component external to the microelectronic package, and the first element contacts are electrically connected with the terminals.

4. The assembly of claim 3,
wherein the surface of the substrate is a first surface, and the terminals are at a second surface of the substrate opposite from the first surface.

5. The assembly of claim 4,
wherein the microelectronic element is a packaged semiconductor chip.

6. The assembly of claim 4,
wherein the substrate includes a conductive element electrically connected with at least one of the terminals, and the conductive material layer is electrically connected with the conductive element.

7. The assembly of claim 1,
wherein the microelectronic element is an unpackaged semiconductor chip.

8. The assembly of claim 1,
wherein the insulating coating is a conformal coating that includes poly-p-xylylene.

9. The assembly of claim 1,
wherein the insulating coating has a maximum thickness of about two microns.

10. The assembly of claim 1,
wherein the microelectronic element is a first unpackaged semiconductor chip, and the first element is a second unpackaged semiconductor chip.

11. The assembly of claim 10,
wherein the first unpackaged semiconductor chip has a second surface opposite the surface at which the contacts are disposed, and second contacts at the second surface electrically connected with the contacts, the assembly further comprising:

a third unpackaged semiconductor chip having contacts at a surface thereof facing the second contacts of the first unpackaged semiconductor chip and joined thereto by respective second electrically conductive masses;

a second thermally and electrically conductive material layer between the surface of the third unpackaged semiconductor chip and the second surface of the first unpackaged semiconductor chip and adjacent second conductive masses of the second conductive masses; and a second electrically insulating coating electrically insulating the second conductive masses, the surface of the third unpackaged semiconductor chip and the second surface of first unpackaged semiconductor chip from the second thermally and electrically conductive material layer.

12. The assembly of claim 1, wherein a dielectric material layer encapsulates the electrically insulating coating.

13. The assembly of claim 12, wherein the dielectric material layer encapsulates the thermally and electrically conductive material layer.

14. The assembly of claim 1, wherein the electrically insulating coating is on the conductive masses and the surfaces of the microelectronic element and the first element.

* * * * *